(12) United States Patent
Naik et al.

(10) Patent No.: US 9,734,881 B2
(45) Date of Patent: Aug. 15, 2017

(54) HIGH SENSING MARGIN MAGNETIC RESISTIVE MEMORY DEVICE IN WHICH A MEMORY CELL READ AND WRITE SELECT TRANSISTORS TO PROVIDE DIFFERENT READ AND WRITE PATHS

(71) Applicant: GLOBALFOUNDRIES Singapore Pte. Ltd., Singapore (SG)

(72) Inventors: Vinayak Bharat Naik, Singapore (SG); Eng Huat Toh, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/008,475

(22) Filed: Jan. 28, 2016

(65) Prior Publication Data
US 2016/0225426 A1 Aug. 4, 2016

Related U.S. Application Data

(60) Provisional application No. 62/110,606, filed on Feb. 2, 2015.

(51) Int. Cl.
*G11C 11/16* (2006.01)
*H01L 27/22* (2006.01)
(Continued)

(52) U.S. Cl.
CPC ......... *G11C 11/165* (2013.01); *G11C 11/161* (2013.01); *H01L 27/228* (2013.01);
(Continued)

(58) Field of Classification Search
CPC .......... G11C 11/16; G11C 11/15; H01L 43/08
(Continued)

(56) References Cited

U.S. PATENT DOCUMENTS

| 6,862,215 | B1 * | 3/2005 | Pancholy | G11C 11/16 365/104 |
| 6,956,766 | B2 * | 10/2005 | Nakamura | G11C 11/15 365/158 |
| 7,272,035 | B1 * | 9/2007 | Chen | G11C 11/16 365/158 |

OTHER PUBLICATIONS

Hai Li et al., "Nonvolatile Memory Design: Magnetic, Resistive, and Phase Change", 2011, pp. 77-78, CRC Press.
(Continued)

*Primary Examiner* — Connie Yoha
(74) *Attorney, Agent, or Firm* — Horizon IP Pte Ltd.

(57) ABSTRACT

A memory device and a method for forming a memory device are disclosed. The memory device includes a memory cell having a storage unit coupled to a cell selector unit. The storage unit includes first and second storage elements. Each of the first and second storage elements includes first and second terminals. The second terminal of the first storage element is coupled to a write source line (SL-W) and the second terminal of the second storage element is coupled to a bit line (BL). The cell selector unit includes first and second selectors. The first selector includes a write select transistor ($T_W$) and the second selector includes a first read transistor ($T_{R1}$) and a second read transistor ($T_{R2}$). The first selector is coupled to a word line (WL) for selectively coupling a write path to the storage unit and the second selector is coupled to a read line (RL) for selectively coupling a read path to the storage unit.

20 Claims, 18 Drawing Sheets

(51) Int. Cl.
H01L 43/02 (2006.01)
G11C 11/15 (2006.01)
(52) U.S. Cl.
CPC .............. *H01L 43/02* (2013.01); *G11C 11/15* (2013.01); *G11C 11/16* (2013.01)
(58) Field of Classification Search
USPC .................................. 365/158, 207, 209, 210
See application file for complete search history.

(56) References Cited

OTHER PUBLICATIONS

Hiroki Noguchi et al., "A 250-MHz 256b-I/O 1-Mb STT-MRAM with Advanced Perpendicular MTJ based Dual Cell for Nonvolatile Magnetic Caches to Reduce Active Power of Processors", Symposium on VLSI Circuits Digest of Technical Papers, 2013. IEEE.

* cited by examiner

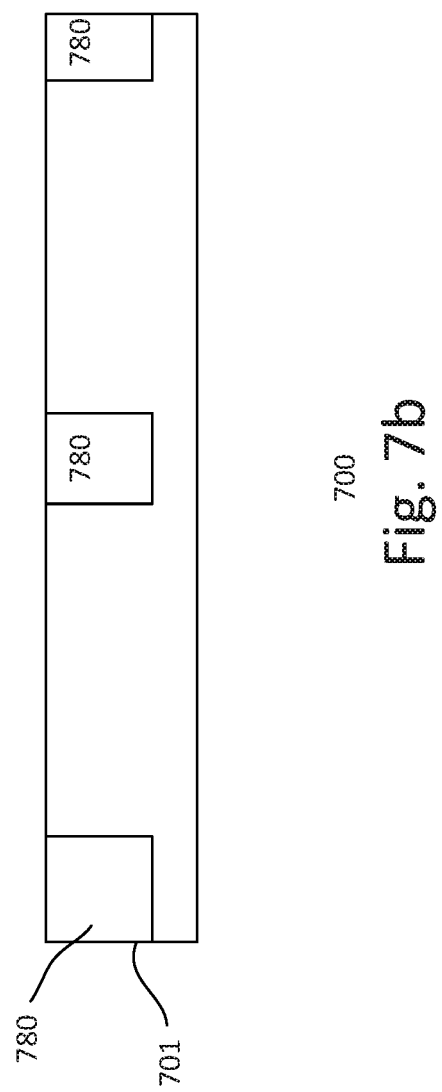

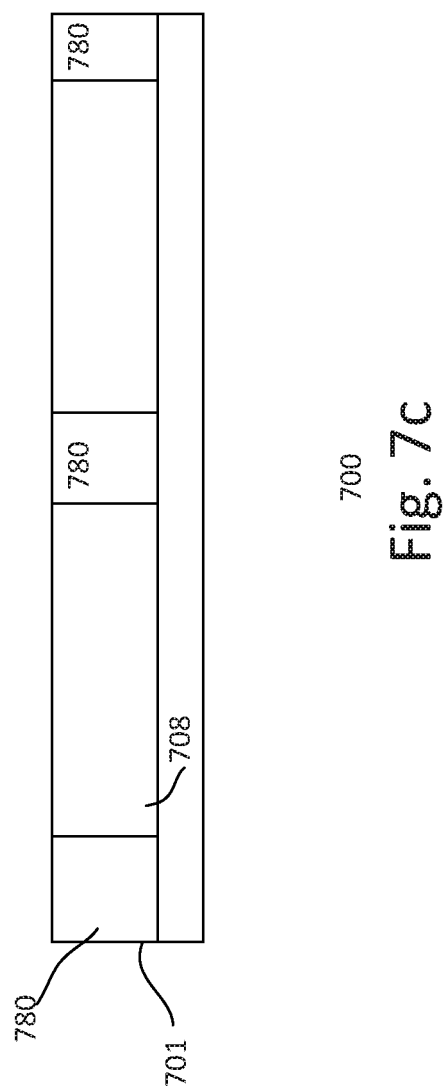

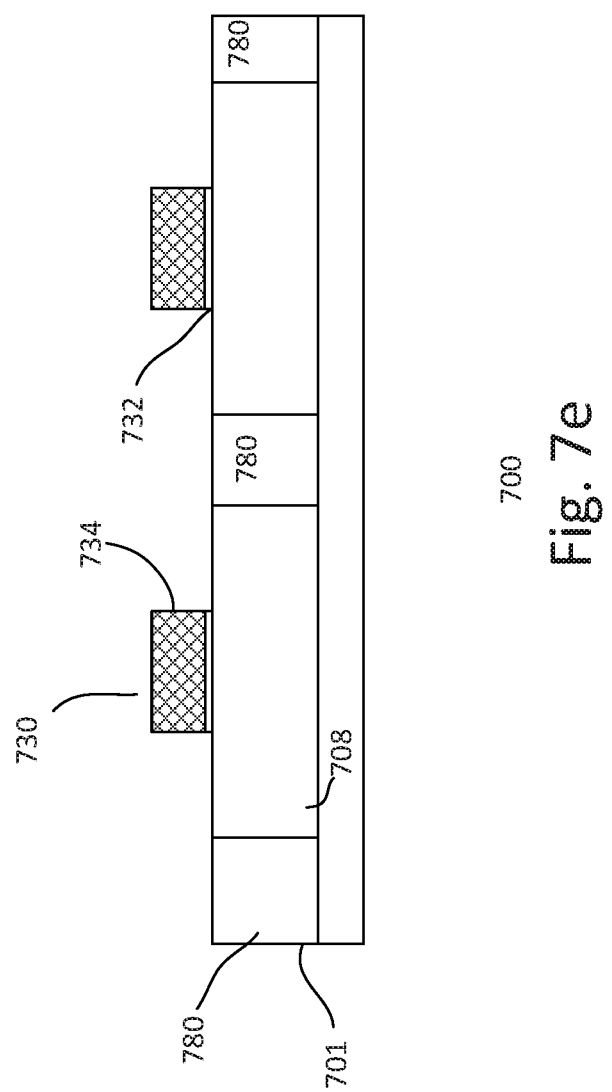

HIGH SENSING MARGIN MAGNETIC RESISTIVE MEMORY DEVICE IN WHICH A MEMORY CELL READ AND WRITE SELECT TRANSISTORS TO PROVIDE DIFFERENT READ AND WRITE PATHS

CROSS-REFERENCE TO RELATED APPLICATION

This application claims the benefit of U.S. Provisional Application Ser. No. 62/110,606, filed on Feb. 2, 2015, which is herein incorporated by reference in its entirety for all purposes.

BACKGROUND

A magnetic memory cell stores information by changing electrical resistance of a magnetic tunnel junction (MTJ) element. The MTJ element typically includes a fixed (pinned) magnetic layer and a free magnetic layer. The fixed (pinned) magnetic layer and the free magnetic layer are laminated such that a tunnel barrier film is formed between the two layers. Magnetic orientation of the free layer flips by a direction or an opposite direction of electric currents exceeding a critical select current. The electrical resistance of the MTJ element changes corresponding to that of the magnetic orientation of the free layer relating to the fixed (pinned) magnetic layer, which may be in either a parallel state or an anti-parallel state.

However, conventional magnetic memory cells require high currents for programming. This results in high power consumption. Additionally, magnetic memory cells suffer from low sensing margin. Low sensing margin creates reliability issues.

From the foregoing discussion, it is desirable to provide low power memory cells with high sensing margin.

SUMMARY

Embodiments generally relate to memory device and method for forming a memory device. In one embodiment, a memory device is disclosed. The memory device includes a memory cell having a storage unit coupled to a cell selector unit. The storage unit includes first and second storage elements. Each of the first and second storage elements includes first and second terminals. The second terminal of the first storage element is coupled to a write source line (SL-W) and the second terminal of the second storage element is coupled to a bit line (BL). The cell selector unit includes first and second selectors. The first selector includes a write select transistor ($T_W$) and the second selector includes a first read transistor ($T_{R1}$) and a second read transistor ($T_{R2}$). The first selector is coupled to a word line (WL) for selectively coupling a write path to the storage unit and the second selector is coupled to a read line (RL) for selectively coupling a read path to the storage unit.

In another embodiment, a method of operating a memory device is disclosed. The method includes providing a memory cell having a storage unit coupled to a cell selector unit. The storage unit includes first and second storage elements. Each of the first and second storage elements includes first and second terminals. The second terminal of the first storage element is coupled to a write source line (SL-W) and the second terminal of the second storage element is coupled to a bit line (BL). The cell selector unit includes first and second selectors. The first selector includes a write select transistor ($T_W$) and the second selector includes a first read transistor ($T_{R1}$) and a second read transistor ($T_{R2}$). The first selector is coupled to a word line (WL) and the second selector is coupled to a read line (RL). A read operation or a write operation is performed with the memory cell. When a write operation is performed, the $T_{R1}$ and $T_{R2}$ are switched off while the $T_W$ is switched on for selectively coupling a write path to the storage unit. When a read operation is performed, the $T_W$ is switched off while the $T_{R1}$ and $T_{R2}$ are switched on for selectively coupling a read path to the storage unit.

In yet another embodiment, a method for forming a memory device is presented. The method includes forming a memory cell which includes forming a storage unit and a cell selector unit. The storage unit is coupled to the cell selector unit. Forming the storage unit includes forming first and second storage elements. Each of the first and second storage elements includes first and second terminals. The second terminal of the first storage element is coupled to a write source line (SL-W) and the second terminal of the second storage element is coupled to a bit line (BL). Forming the cell selector unit includes forming first and second selectors. The first selector includes a write select transistor ($T_W$) and the second selector includes a first read transistor ($T_{R1}$) and a second read transistor ($T_{R2}$). The first selector is coupled to a word line (WL) for selectively coupling a write path to the storage unit and the second selector is coupled to a read line (RL) for selectively coupling a read path to the storage unit.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 7a-7k show cross-sectional views of a process for forming a memory cell.

DETAILED DESCRIPTION

Embodiments of the present disclosure generally relate to memory cells. In one embodiment, the memory cells are magnetic resistive memory cells, such as magnetic random access memory (MRAM). Magnetic resistive memory cells include magnetic tunneling junction (MTJ) elements. Other suitable types of resistive memory cells may also be useful.

The embodiments as described in this disclosure can also be implemented in other technologies which require separate transistors for READ and WRITE operations to tighten the sensing distribution. The memory cells are configured to produce fast write time and high sensing margin. The memory cells can be incorporated into or used with, for example, electronic products such as mobile phones, smart card, mass storage, enterprise storage and industrial and automotive products.

Figure 1A:
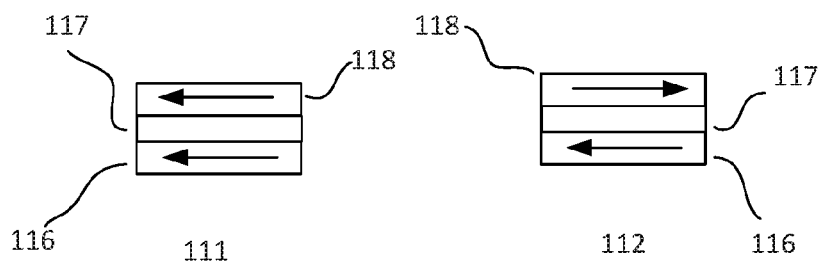
FIGS. 1a-1b show diagrams of parallel state and anti-parallel state of a MTJ element.

FIG. 1a shows a simplified cross-sectional view of an embodiment of a MTJ element 110a. As shown, the magnetization or magnetic orientations of the magnetic element is configured to be in a horizontal direction. Horizontal direction, for example, refers to a direction along or parallel to a substrate surface. A MTJ element includes a magnetically fixed (pinned) layer 116, a tunneling barrier layer 117 and a magnetically free layer 118. The magnetic orientation of the fixed layer is fixed while the magnetic orientation of the free layer may be programmed to be in a first or same direction as the fixed layer or in a second or opposite direction as the fixed layer. For example, as shown by structure 111, the magnetic direction of the free layer is programmed to be in the first or parallel direction as the fixed layer. The corresponding MTJ electrical resistance between the free layer 118 and the fixed layer 116 is denoted as $R_P$. Structure 112 illustrates that the magnetization of the free layer is programmed to be in a second or anti-parallel direction as the fixed layer. The corresponding MTJ electrical resistance between the free layer 118 and the fixed layer 116 is denoted as $R_{AP}$. The resistance $R_{AP}$ is higher than the resistance $R_P$.

Figure 1B:
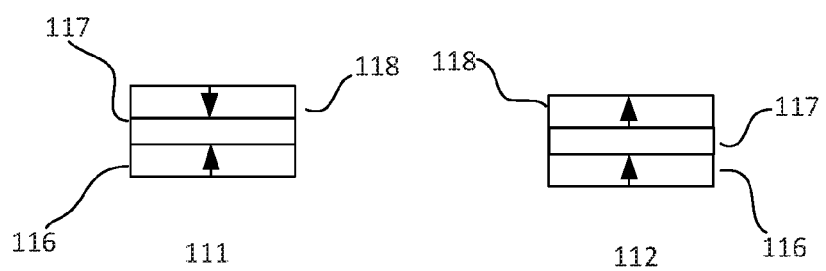

FIG. 1b shows magnetic orientations in the magnetic layers of a MTJ element 110b in vertical direction. Vertical direction, for example, refers to a direction perpendicular to a substrate surface. As shown in FIG. 1b, MTJ element 110b includes a fixed (pinned) layer 116, a barrier layer 117 and a free layer 118. When the MTJ element 110b is in a magnetic anti-parallel state, magnetic orientations of the free layer 118 and the fixed layer 116 are in opposite directions as shown by structure 111. The corresponding MTJ electrical resistance between the free layer 118 and the fixed layer 116 is denoted as $R_{AP}$. When the MTJ element 110b is in a magnetic parallel state, magnetic orientations of the free layer 118 and the fixed layer 116 are in the same direction as shown by structure 112. The corresponding MTJ electrical resistance between the free layer 118 and the fixed layer 116 is denoted as $R_P$.

Figure 2A:
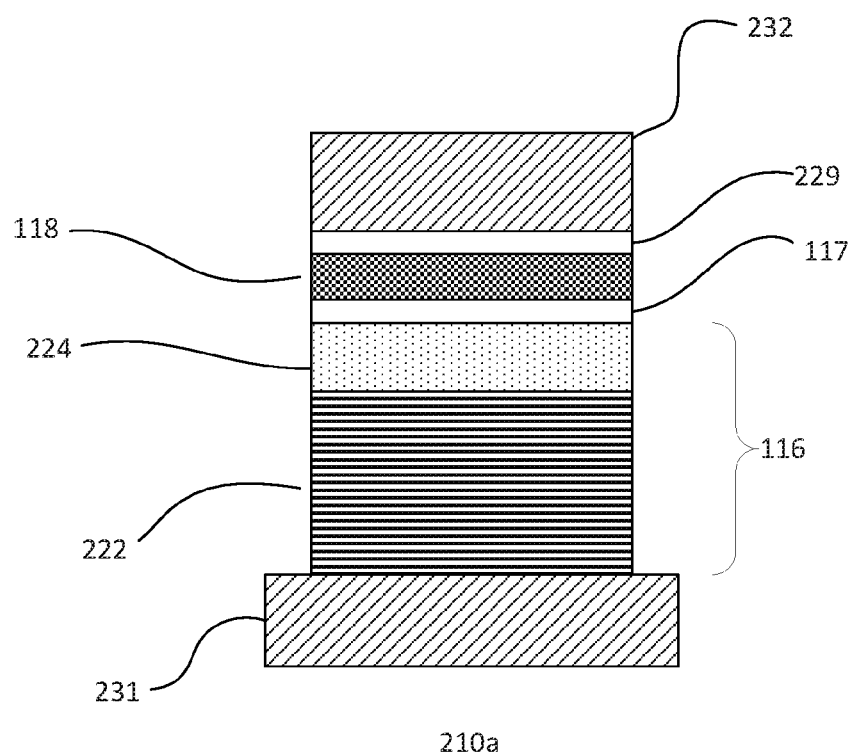
FIGS. 2a-2b show cross-sectional views of embodiments of MTJ elements.
Figure 2B:
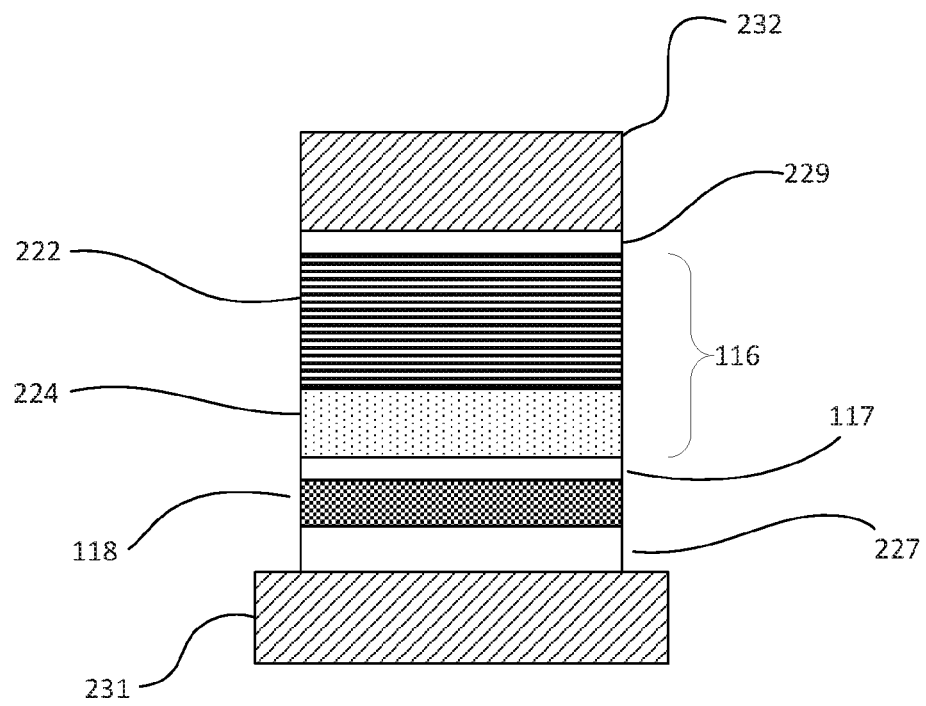

FIGS. 2a-2b show cross-sectional views of exemplary embodiments of MTJ stacks or elements. FIG. 2a shows a bottom-pinned MTJ element 210a and FIG. 2b shows a top-pinned MTJ element 210b. Top-pinned and bottom-pinned refer to position of layers relative to the substrate surface.

As shown in FIG. 2a, bottom-pinned MTJ stack 210a includes a bottom electrode 231, a magnetically fixed (pinned) or reference layer 116, a tunneling barrier layer 117, a magnetically free layer 118, a cap layer 229 and a top electrode 232 on the cap layer 229. The fixed layer 116, in one embodiment, includes a magnetic layer 224 and a pinning layer 222 on the bottom electrode 231. The pinning layer, for example, pins the magnetic orientation of the magnetic layer, forming a pinned layer.

The free layer and the reference layer may be CoFeB or CoFe based composite material, the tunneling barrier layer may be MgO or $Al_2O_3$, and the magnetic layer may be CoFeB/Ru/CoFeB. As for the pinning layer, it may be PtMn, IrMn or multilayers of (Co/Pt), (Co/Ni), etc. The top and bottom electrodes may be TaN or Ta. Other suitable configurations or materials for the MTJ stack may also be useful.

As shown in FIG. 2b, top-pinned MTJ stack 210b includes a bottom electrode 231, a buffer layer 227, a free layer 118, a tunneling barrier layer 117, a fixed layer 116, a cap layer 229 and a top electrode 232 on the cap layer 229. The fixed layer 116, in one embodiment, includes a magnetic layer 224 and a pinning layer 222. The pinning layer, for example, pins the magnetic orientation of the magnetic layer, forming a pinned layer.

The free layer and the reference layer may be CoFeB or CoFe based composite material, the tunneling barrier layer may be MgO or $Al_2O_3$, and the magnetic layer may be CoFeB/Ru/CoFeB. As for the pinning layer, it may be PtMn, IrMn or multilayers of (Co/Pt), (Co/Ni) etc. The top and bottom electrodes may be TaN or Ta and the buffer layer may be Ru. The buffer layer, for example, serves to prevent diffusion of the material of the bottom electrode into the tunneling barrier layer. Other suitable configurations or materials for the MTJ stack may also be useful.

Figure 3:
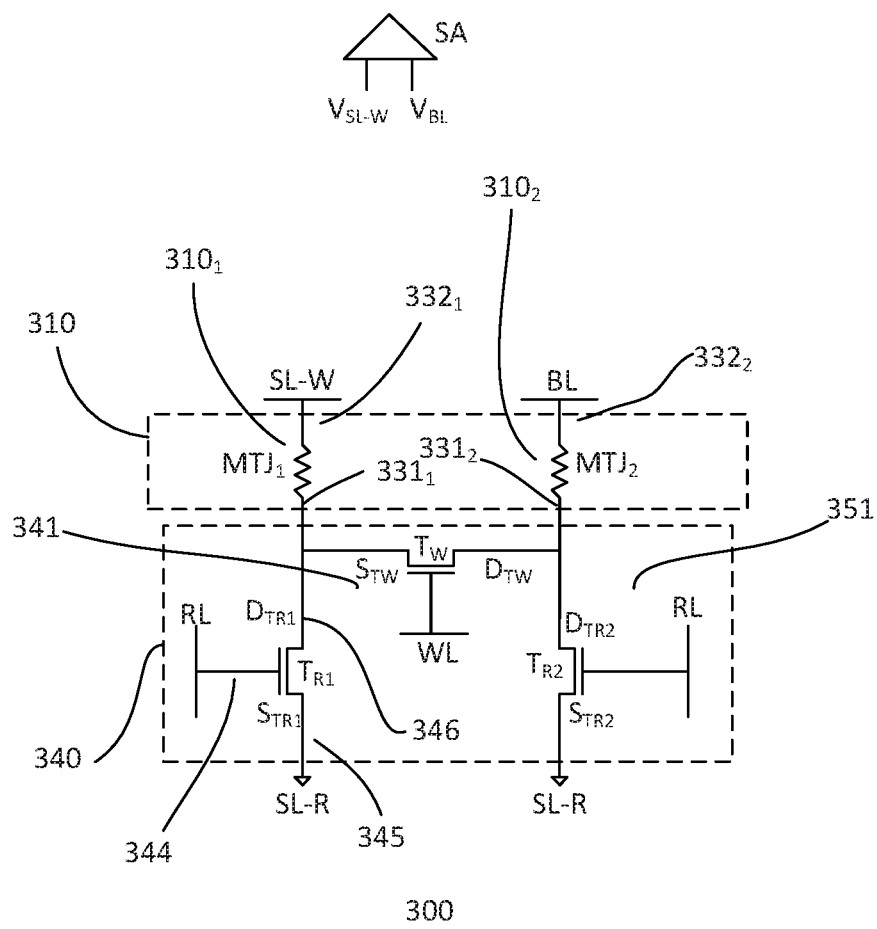
FIG. 3 shows a schematic diagram of an embodiment of a memory cell.

FIG. 3 shows a schematic diagram of an embodiment of a memory cell 300. The memory cell is a non-volatile memory cell. For example, the memory cell may be a magnetic memory cell. In one embodiment, the memory cell is a Spin Torque Transfer-Magnetic Random Access Memory (STT-MRAM) cell. Other suitable types of memory cells may also be useful. The memory cell includes a storage unit 310 and a cell selector unit 340. The storage unit is coupled to the cell selector unit. The storage unit 310, in one embodiment, includes first and second storage elements $310_1$ and $310_2$. The storage elements, for example, may be resistive storage elements. In one embodiment, the storage elements are magnetic resistive memory storage elements, such as MTJ storage elements. For example, the storage elements include $MTJ_1$ and $MTJ_2$. The MTJ elements may be such as those described in FIGS. 1a-1b and 2a-2b. Other suitable types of MTJ or resistive storage elements may also be useful.

First storage element $310_1$ includes first and second electrodes $331_1$ and $332_1$. The first electrode, for example, may be a bottom electrode while the second electrode may be a top electrode. Other configurations of electrodes may also be useful. Second storage element $310_2$ may similarly include a first electrode $331_2$ and a second electrode $332_2$. The first electrode, for example, may be a bottom electrode while the second electrode may be a top electrode. In one embodiment, the top electrode $332_1$ of the first storage element $310_1$ is electrically connected to a write source line SL-W. The top electrode $332_2$ of the second storage element $310_2$ is electrically connected to a bit line (BL).

Cell selector unit 340 includes first and second selectors or selector subunits 341 and 351. The first selector subunit, for example, may be a write selector and the second selector subunit is a read selector. The selectors, in one embodiment, include one or more select transistors, such as metal oxide semiconductor (MOS) transistors. In one embodiment, the transistors are n-type MOS transistors. Other types of transistors may also be useful. A select transistor, as shown, includes first and second source/drain (S/D) terminals 345 and 346 and a gate or control terminal 344. The first S/D terminal may be referred to as a source terminal and the second S/D terminal may be referred to as a drain terminal. Other types of selectors may also be useful. The write selector selectively couples a write channel or path to the storage unit. The read selector selectively couples a read channel or path to the storage unit. A word line (WL) is coupled to a write control terminal of the write channel selector for selectively coupling the write channel to the storage unit while a read line (RL) is coupled to a read control terminal of the read channel selector for selectively coupling the read channel to the storage unit.

In one embodiment, the write selector includes a write transistor $T_W$. The write selector is commonly coupled to first terminals of the storage elements. For example, a first terminal $S_{TW}$ of $T_W$ is coupled to the first terminal of the first storage element $MTJ_1$ and a second terminal $D_{TW}$ of $T_W$ is coupled to the first terminal of the second storage element $MTJ_2$. For example, the source terminal $S_{TW}$ of $T_W$ is coupled to the first terminal of the first storage element $MTJ_1$ and a drain terminal $D_{TW}$ of $T_W$ is coupled to the first terminal of the second storage element $MTJ_2$. The control or gate terminal of $T_W$ is coupled to the word line (WL).

In one embodiment, the read selector includes first and second read transistors $T_{R1}$ and $T_{R2}$. First or source terminals $S_{TR1}$ and $S_{TR2}$ of $T_{R1}$ and $T_{R2}$ are coupled to a read source line SL-R. For example, $S_{TR1}$ and $S_{TR2}$ are commonly coupled to the SL-R. The second or drain terminal $D_{TR1}$ of $T_{R1}$ is commonly coupled to the first terminal of the first storage element and $S_{TW}$ while the second or drain terminal $D_{TR2}$ of $T_{R2}$ is commonly coupled to the first terminal of the second storage element and the $D_{TW}$. The gate or control terminals of $T_{R1}$ and $T_{R2}$ are coupled to a read line (RL). For example, the gate or control terminals of $T_{R1}$ and $T_{R2}$ are coupled to the read line (RL).

In one embodiment, the SL-W and BL are coupled to a sense amplifier (SA). For example, BL is coupled to a positive or + terminal of the SA while SL-W is coupled to a negative or − terminal of the SA. Other configurations of coupling SL-W and BL to the SA may also be useful. During a read or write operation, the voltages of SL-W and BL are provided to the SA.

Table 1 below shows exemplary signals or bias conditions applied to the memory cell for read and write operations.

TABLE 1

| operation | signal (V) | | | | |
|---|---|---|---|---|---|
| | SL-W | BL | RL | WL | SL-R |
| Write "1" ($MTJ_2$) and Write "0" ($MTJ_1$) | 1.1 (high) | 0 | 0 | 1.1 | 0 |
| Write "0" ($MTJ_2$) and Write "1" ($MTJ_1$) | 0 (low) | 1.1 | 0 | 1.1 | 0 |
| Read | Sense | Sense | 1.1 | 0 | 1.1 |

The voltage values for logic high is 1.1 V and a logic low is 0 V. The voltage values are exemplary and may change depending on, for example, the technology. In addition, the voltage and logic values as presented are for a memory cell with n-type MOS transistors and for MTJ with bottom-pinned structure, i.e. free layer or storage layer is disposed on top of the tunnel barrier (e.g., MgO). The values may change for other types of select transistors.

Figure 4A:
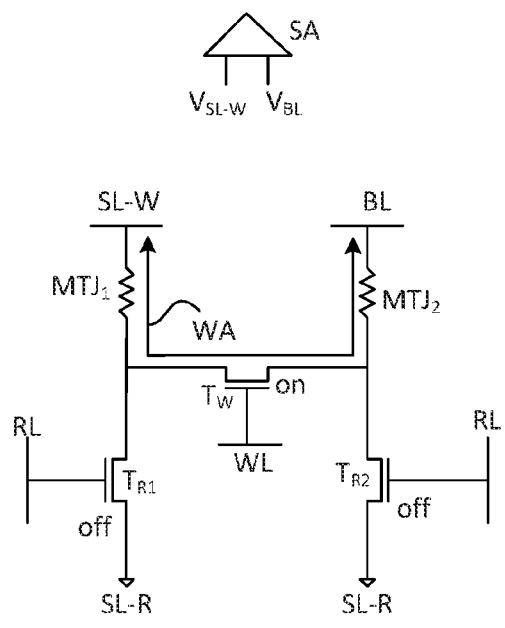
FIGS. 4a-4b illustrate write and read operations of an embodiment of a memory cell.

FIG. 4a illustrates a write operation of a memory cell 400. For a write operation, $T_{R1}$ and $T_{R2}$ are switched off while $T_W$ is switched on. This results in a write path as shown by the write path arrow (WA). Depending on the voltages applied to SL-W and BL, a 1 or 0 is written to $MTJ_1$ and the complement is written to $MTJ_2$ symmetrically.

Figure 4B:
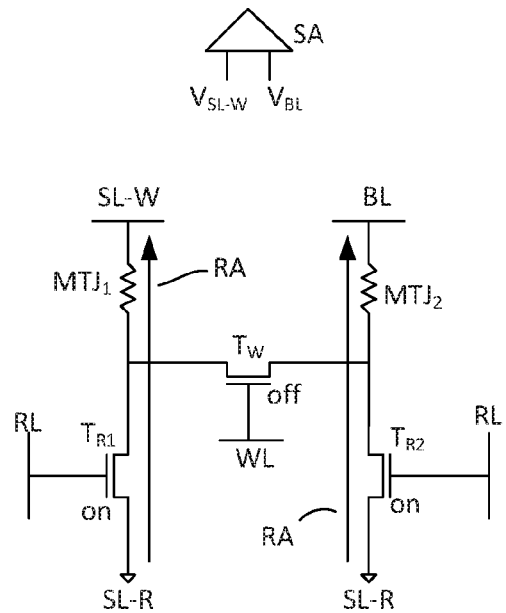

FIG. 4b illustrates a read operation of an embodiment of a memory cell 400. For a read operation, $T_W$ is switched off while $T_{R1}$ and $T_{R2}$ are switched on. This couples the BL and SL-W to SL-R, as shown by read arrows (RA). Depending on the resistance of the storage elements, voltages from SL-W and BL are presented to the sense amplifier (SA). The voltages from SL-W and BL indicate whether a 0 or 1 is sensed by the SA.

As shown above, the memory cell includes a 3 transistors-2 MTJ (3T-2MTJ) structure. This structure improves READ and WRITE distributions for high speed and low power applications which potentially may be used to replace SRAM, etc. As described, the memory cell employs separate transistors for read and write operations. This enables separate tuning of the transistors, resulting in high speed and high reliable operations for the MRAM device. Furthermore, the SA senses voltages from both first and second resistive elements which are of the opposite resistance (high and low). This improves sensing margin. For example, sensing margin is doubled, thereby improving sensing reliability. In addition, the switching of the first and second storage elements is achieved by a single current pulse at once. This avoids the need of an additional power to switch the two storage elements using two separate current pulses which reduces power consumption.

Figure 5:
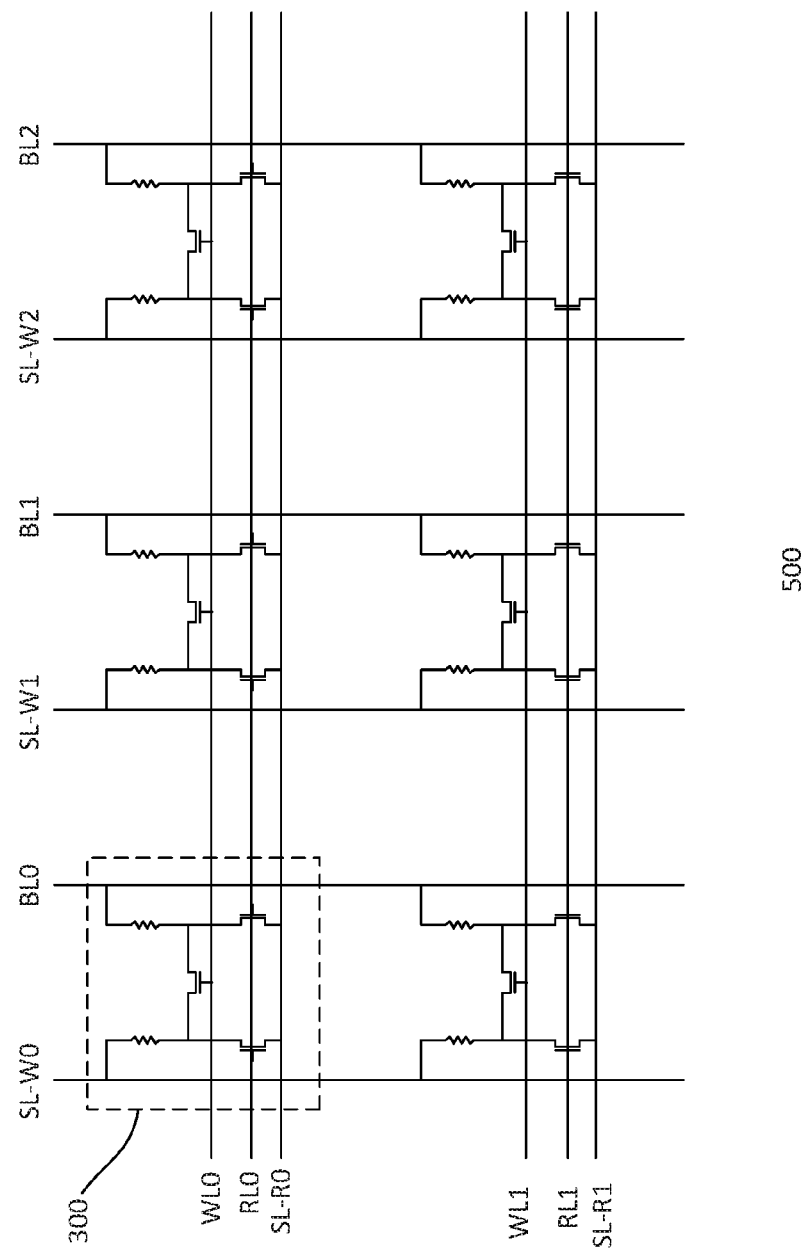
FIG. 5 shows a schematic diagram of an embodiment of a portion of a memory array.

FIG. 5 shows a schematic diagram of an embodiment of a memory array 500. The array includes a plurality of interconnected memory cells 300. The memory cells may be similar to those described in FIG. 3. For example, the memory cells are MRAM cells, such as STT-MRAM cells. Other types of memory cells may also be useful. The embodiment as described can be implemented in other technologies which also require separate transistors for READ and WRITE operations to tighten the sensing distribution. Common elements may not be described or described in detail.

As shown, the array includes six memory cells arranged in a 2×3 array. For example, the array is arranged to form two rows and three columns of memory cells. Memory cells of a row are interconnected by WL, RL and SL-R lines (WL0, RL0 and SL-R0 or WL1, RL1 and SL-R1) while memory cells of a column are interconnected by SL-W and BL lines (SL-W0 and BL0, or SL-W1 and BL1 or SL-W2 and BL2).

Figure 6A:
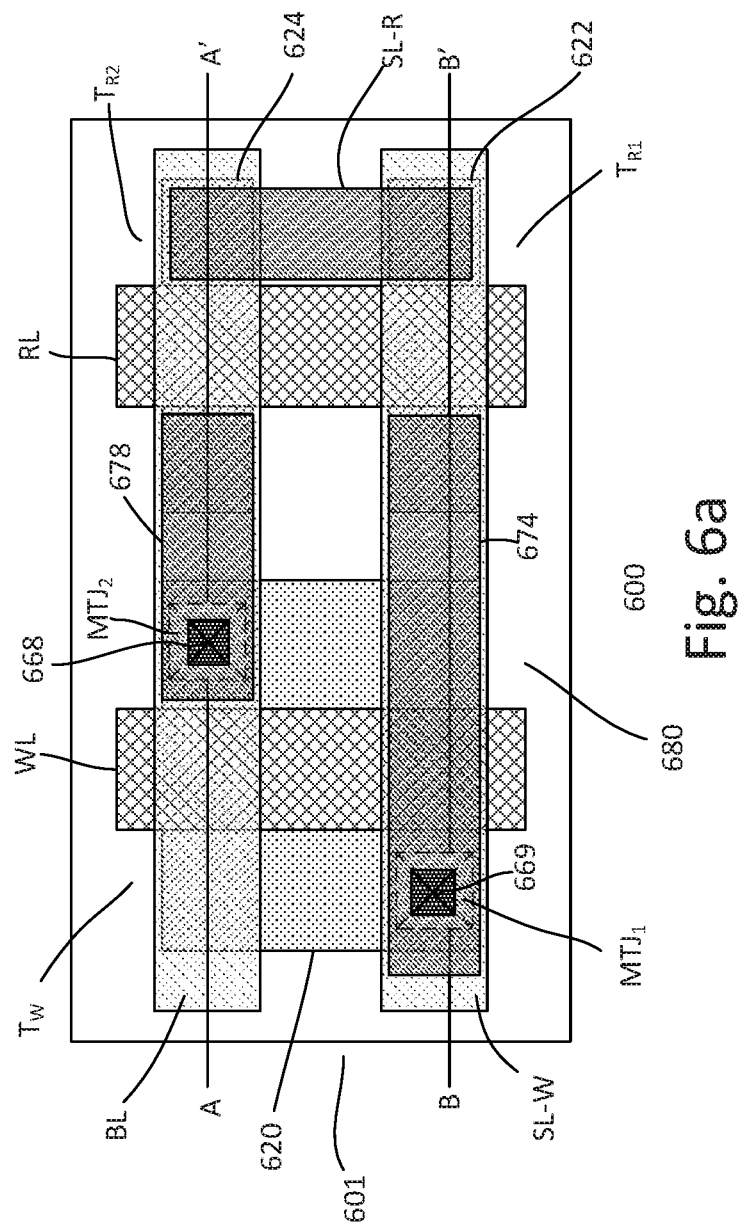
FIGS. 6a-6c show top and cross-sectional views of an embodiment of a memory cell.
Figure 6B:
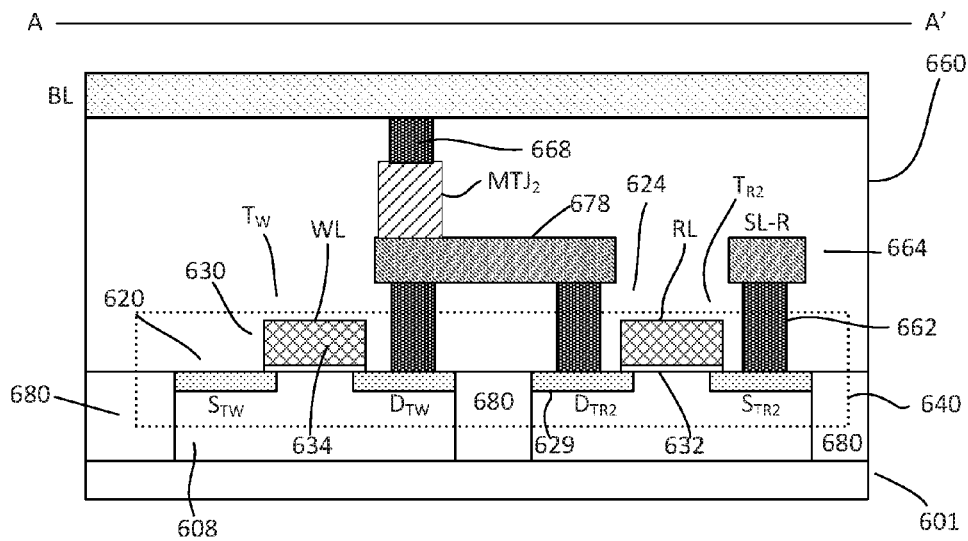
Figure 6C:
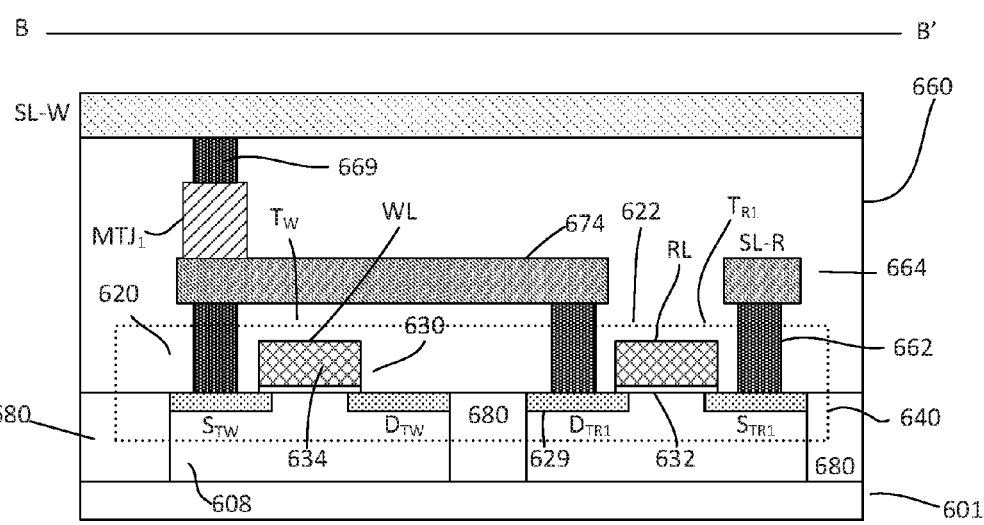

FIG. 6a shows a top view of an embodiment of a device 600 while FIGS. 6b-6c, show cross-sectional views of the device along A-A' and B-B'. The device, as shown, includes a memory cell. The memory cell, for example, may be a non-volatile memory (NVM) memory cell. The memory cell, in one embodiment, is a magnetoresistive NVM cell, such as a STT-MRAM cell. The memory cell, for example, is similar to that described in FIG. 3. Common elements may not be described or described in detail.

The memory cell is disposed on a substrate 601. For example, the memory cell is disposed in a cell region of the substrate. The cell region may be part of an array region. For example, the array region may include a plurality of cell regions. The substrate may include other types of device regions (not shown), such as high voltage (HV) as well as logic regions, including low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, includes silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Isolation regions 680, as shown in FIGS. 6a-6c, may be provided. In one embodiment, the isolation regions are shallow trench isolation (STI) regions. Other types of isolation regions may also be useful. The isolation regions are provided to isolate device regions from other regions. In one embodiment, isolation regions may be provided to isolate memory cells from each other. Other suitable configurations of isolation regions may also be useful.

A cell selector unit 640 is provided in the cell region. The cell selector unit includes first and second selectors or selector subunits. The first selector, for example, may be a write selector and the second selector is a read selector. The selectors, in one embodiment, include transistors. For example, the transistors of the selectors are metal oxide semiconductor (MOS) transistors. In one embodiment, the MOS transistors are n-type MOS transistors. Other types of cell selectors may also be useful.

The cell region includes a well 608, as shown in FIGS. 6b-6c, which serves as body of the transistors of the selector units. For example, the cell region includes a body or device well for transistors of the write and read selector subunits and is continuous for the entire memory array. The body well may be doped with second polarity type dopants for first polarity type select transistors. The body well, in one embodiment, is a p-type doped well for n-type transistors. The device well may be lightly or intermediately doped with second polarity type dopants. For example, the device well may have a dopant concentration of about 1E16 to 1E19/cm$^3$. Other suitable dopant concentrations may also be useful.

In one embodiment, the isolation region separates the cell from other cells as well as select transistors of the cell from each other. For example, the isolation region defines write transistor active region 620 and read transistor active regions 622 and 624. Other suitable configurations of isolation regions may also be useful.

A transistor, as shown, includes first and second source/drain (S/D) regions 629 and gate 630 disposed on the substrate between the S/D regions. A gate, for example, may include a gate electrode 634 over a gate dielectric 632. The gate electrode may be polysilicon while the gate dielectric may be silicon oxide. Other suitable types of gate electrode and gate dielectric materials may also be useful. A gate, for example, may be a gate conductor along a first or word line (WL) direction. The gate conductor forms a common gate for a row of memory cells.

As for the S/D regions, they are heavily doped regions with first polarity type dopants. For example, the S/D regions are heavily doped n-type regions for forming n-type transistors. Providing S/D regions with p-type dopants may also be useful. The S/1 regions may include lightly doped (LD) extension regions. The gate may include dielectric sidewall spacers (not shown). The spacers, for example, facilitate forming the lightly doped (LD) extension regions (not shown) and S/D regions. The LD extension regions, for example, are lightly doped regions extending slightly under the gate.

In one embodiment, the read selector subunit includes first and second read transistors $T_{R1}$ and $T_{R2}$. As for the write selector subunit, in one embodiment, it includes a write select transistor $T_W$. The first read transistor is disposed in the first read transistor active region, the second read transistor is disposed in the second read transistor active region and the write transistor is disposed in the write transistor active region. As shown, the dimensions of the read transistors are smaller than the write transistors. For example, a larger write transistor is desired to increase write performance while a large read transistor is not necessary since a large read current is not needed. The first and second read transistors, for example, are aligned adjacent in a first or row direction while the write transistor is aligned adjacent to the read transistors in a second or column direction.

The cell region may be configured in a rectangular shape. Other cell region shapes may also be useful. In one embodiment, the first and second read transistor regions are aligned adjacent in the first or row direction within the cell region while the write transistor region is aligned adjacent to the read transistor regions in the second or column direction within the cell region. A common read gate conductor traverses the read transistor regions. The gate conductor serves as a common gate and also serves as a common RL for the read transistors. First drain and source regions $D_{TR1}$ and $S_{TR1}$ are disposed between RL in the first transistor region. Second drain and source regions $D_{TR2}$ and $S_{TR2}$ are disposed between RL in the second transistor region. For example, the drain regions and source regions of the read transistors are aligned in the row direction. As for the write transistor region, a write gate conductor traverses it and is disposed between drain and source regions $D_{TW}$ and $S_{TW}$. Other configurations of the transistors of the cell region may also be useful.

Disposed over the transistors is a dielectric layer 660. The dielectric layer serves as a backend dielectric layer. The backend dielectric layer may include one or more interlevel dielectric (ILD) layers. An ILD layer includes a metal level and a contact level. The metal level includes conductors or metal lines while the contact level includes contacts. The conductors and contacts may be formed of a metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE), may also be employed to form metal lines.

As discussed, the backend dielectric layer may include a plurality of ILD levels. For example, x number of ILD levels may be provided. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels.

For the first contact level, it may be referred to as a CA or a pre-metal dielectric (PMD) level. The first metal level may be referred to as M1. For the first ILD level, contacts and metal lines may be formed by separate single damascene processes. Contacts in the PMD level may be tungsten contacts while conductors or metal lines in M1 may be copper or copper alloy. For upper ILD levels, metal lines and contacts may be formed by dual damascene techniques. Dual damascene processes may employ copper or copper alloys for contacts and conductive lines. Other configurations or techniques for forming lines and contacts of the ILD levels may also be useful.

A dielectric liner may be disposed between ILD levels. The dielectric liner, for example, serves as an etch stop layer. The dielectric liner may be formed of a low k dielectric. For example, the dielectric liner may be nBLOK. Other types of dielectric materials for the dielectric liner may also be useful.

As shown in FIGS. 6b-6c, contacts 662 are disposed in the CA level of the backend dielectric layer. The contacts, for example, are in communication with the drain and source regions of the select transistors. Conductive lines 664 are disposed in the first metal or M1 level above the CA level. In one embodiment, a read source line SL-R is disposed in M1 which commonly couples the source regions $S_{TR1}$ and $S_{TR2}$ of the first and second read transistors $T_{R1}$ and $T_{R2}$. In addition, an interconnect 678 is disposed in M1 to couple the source $D_{TW}$ of $T_W$ and drain $D_{TR2}$ of $T_{R2}$, as shown in FIG. 6b, and an interconnect 674 is disposed in M1 to couple $S_{TW}$ of $T_W$ and drain $D_{TR1}$ of $T_{R1}$, as shown in FIG. 6c. It is understood that various connections to the transistors may be formed in other metal levels.

Storage elements may be disposed in the backend dielectric layer above the interconnects connecting to the various transistors of the select unit. For example, the storage elements may be disposed over the first metal level. Providing the storage elements in other metal levels may also be useful. The storage element may be provided in a storage dielectric level. The storage dielectric level may be a contact level of an ILD level. For example, the storage dielectric level may be V1 above M1. Other dielectric levels of the backend dielectric levels may also be useful.

The storage elements may be magnetic storage elements, such as MTJ elements described in FIGS. 1a-1b and 2a-2b. Other types of storage or resistive storage elements may also be useful. In one embodiment, first and second magnetic elements $MTJ_1$ and $MTJ_2$ are disposed in the storage dielectric layer. In one embodiment, $MTJ_2$ is coupled to $D_{TW}$ and $D_{TR2}$, as shown in FIG. 6b, and $MTJ_1$ is coupled to $S_{TW}$ and $D_{TR1}$, as shown in FIG. 6c.

Above the storage dielectric layer is a metal layer of an ILD level. For example, the metal layer is M2. Other metal layers may also be useful. The metal layer includes metal lines disposed in a dielectric layer. The metal line and top of the dielectric layer have coplanar top surfaces. In one embodiment, a bit line (BL) is coupled to $MTJ_2$ through a contact 668, as shown in FIG. 6b, and a SL-W line is coupled to $MTJ_1$ through a contact 669, as shown in FIG. 6c.

Although as described, the various lines and storage elements are disposed in specified dielectric levels of the backend dielectric levels, other configurations may also be useful. For example, they may be disposed in other levels. Furthermore, the device may include other device regions, additional metal levels and components.

FIGS. 7a-7k show cross-sectional views of a process 700 of forming an embodiment of a device. The process includes forming a memory cell. The memory cell, for example, may be a NVM memory cell. The memory cell, in one embodiment, is a magnetoresistive NVM cell, such as a STT-MRAM cell. The memory cell, for example, is similar to that described in FIGS. 6a-6c. Common elements may not be described or described in detail.

The cross-sectional views, for example, are along the bit line direction. The cross-sectional view is along A-A' as shown in FIG. 6b. Although the cross-sectional view is along A-A', reference may be made to B-B' as well, as shown in FIG. 6c. Furthermore, although the cross-sectional views show one memory cell, it is understood that the device includes a plurality of memory cells of, for example, a memory array. In one embodiment, the process of forming the STT-MRAM cell is highly compatible with CMOS logic process. For example, the STT-MRAM cell can be formed simultaneously with CMOS logic devices (not shown) on the same substrate.

Referring to FIG. 7a, a substrate 701 is provided. The substrate, for example, is a semiconductor substrate, such as a silicon substrate. For example, the substrate may be a lightly doped p-type substrate. Providing an intrinsic or other types of doped substrates, such as silicon germanium (SiGe), germanium (Ge), gallium arsenide (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, includes silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

In FIG. 7b, the substrate is processed to define a cell region in which a memory cell is formed. The cell region may be part of an array region. For example, the array region may include a plurality of cell regions. The substrate may include other types of device regions, such as a logic region. Other types of regions may also be provided.

Isolation regions 780 are formed in the substrate. In one embodiment, the isolation regions are shallow trench isolation (STI) regions. Other types of isolation regions may also be useful. The isolation regions are provided to isolate device regions from other regions. The isolation regions may also isolate transistors within a cell region. Isolation regions may be formed by, for example, etching trenches in the substrate and filling them with a dielectric material, such as silicon oxide. A planarization process, such as chemical mechanical polish (CMP), is performed to remove excess dielectric material, leaving, for example, STI regions isolating the device regions.

Referring to FIG. 7c, a doped well or device well 708 is formed. The well, for example, serves as body of select transistors of the memory cell. In one embodiment, second polarity type dopants are implanted into the substrate to form the doped well. In one embodiment, an implant mask may be employed to implant the dopants to form the doped well. The implant mask, for example, is a patterned photoresist layer. The implant mask exposes regions of the substrate in which the second polarity wells are formed. The device well may be lightly or intermediately doped with second polarity type dopants. For example, the device well may have a dopant concentration of about 1E16 to 1E19/$cm^3$. Other dopant concentrations may also be useful.

Figure 7D:
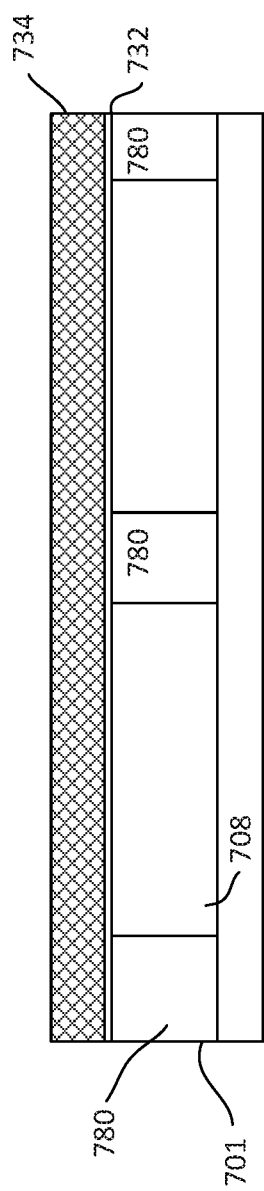

As shown in FIG. 7d, gate layers are formed on the substrate. The gate layers, in one embodiment, include a gate dielectric layer 732 and a gate electrode layer 734 thereover. The gate dielectric layer, for example, may be a silicon oxide layer formed by, thermal oxidation. As for the gate electrode layer, it may be a polysilicon layer formed by chemical vapor deposition (CVD). Other suitable types of gate layers or techniques for forming gate layers may also be useful.

Referring to FIG. 7e, the gate layers are patterned to form gates 730 of the select transistors. Patterning the gate layers may be achieved using mask and etch techniques. For example, a soft mask, such as photoresist may be formed over the gate electrode layer. An exposure source may selectively expose the photoresist layer through a reticle containing the desired pattern. After selectively exposing the photoresist layer, it is developed to form openings corresponding to location where the gate layers are to be removed. To improve lithographic resolution, an anti-reflective coating may be used below the photoresist layer. The patterned mask layer is used to pattern the gate layers. For example, an anisotropic etch, such as reactive ion etch (RIE), is used to remove exposed portions of the gate layers. Other types of etch processes may also be useful. The etch transfers the pattern of the mask layer to the underlying gate layers. Patterning the gate layers forms gates of the select transistors. The gates, for example, may be gate conductors along a first or word line direction. A gate conductor forms a common gate for a row of memory cells.

Figure 7F:
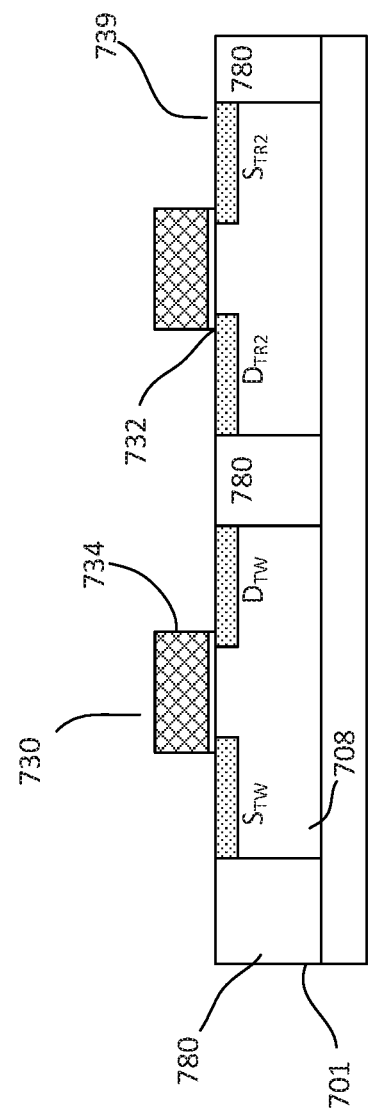

Referring to FIG. 7f, an implant is performed to form S/D regions 739 after forming the gates. The implant implants first polarity type ions into the substrate adjacent to the gates. In one embodiment, the implant forms heavily doped S/D regions in the substrate adjacent to the gates. For example, $S_{TW}$, $D_{TW}$, $S_{TR1}$, $D_{TR1}$, $S_{TR2}$ and $D_{TR2}$ are formed for $T_W$, $T_{R1}$ and $T_{R2}$. Lightly doped (LD) extension regions may be formed as part of the process to form S/D regions. The LD extension regions are formed prior to forming the heavily doped S/D regions. For example, a LD implant is performed to form LD extension regions, followed by forming dielectric spacers on gate sidewalls. The implant to form the S/D regions is performed after sidewall spacers formation.

A dielectric etch stop liner may be formed over the transistors. The etch stop liner, for example, is a nitride etch stop liner. Other types of dielectric etch stop liners may also be useful. The etch stop liner serves as an etch stop for subsequent processes, such as contacts formation.

Figure 7G:
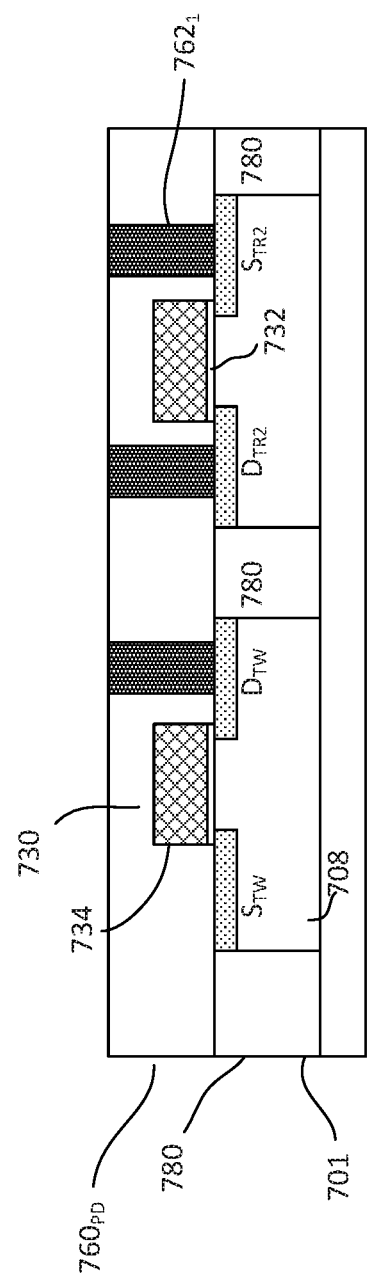

Referring to FIG. 7g, a dielectric layer $760_{PD}$ is formed on the substrate, covering the transistors. The dielectric layer, for example, serves as a dielectric layer of an ILD layer. For example, the dielectric layer serves as a PMD or CA level of an ILD layer. The dielectric layer, for example, is a silicon oxide layer. Other types of dielectric layers may also be useful. The dielectric layer may be formed by CVD. Other techniques for forming the dielectric layer may also be useful. A planarizing process may be performed to produce a planar surface. The planarizing process, for example, may include CMP. Other types of planarizing processes may also be useful.

In one embodiment, contacts $762_1$ are formed in the dielectric layer. The contacts, for example, connect to contact regions, such as S/D regions and gates of the transistors. Forming the contacts may include forming contact vias in the dielectric layer to expose the contact regions. As shown, the contacts $762_1$ are coupled to $D_{TW}$, $D_{TR2}$ and $S_{TR2}$. Although not shown, contacts for other S/D regions and gates are also formed. Forming the contact vias may be achieved using mask and etch techniques, as previously described. After the vias are formed, a conductive material is deposited to fill the vias. The conductive material, for example, may be tungsten. Other types of conductive materials may also be useful. A planarization process, such as CMP, is performed to remove excess conductive material, leaving contact plugs in the contact vias.

Figure 7H:
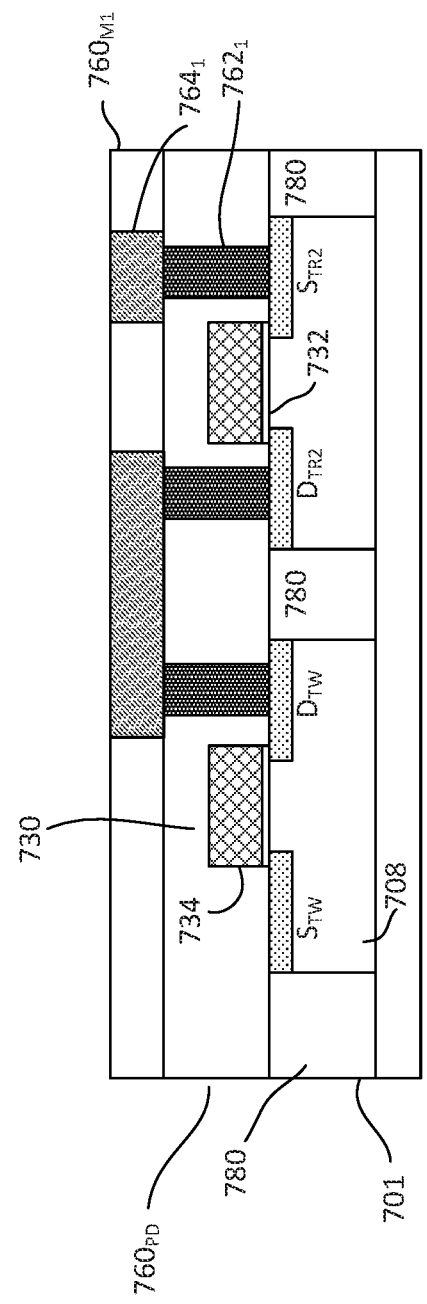

In FIG. 7h, a dielectric layer $760_{M1}$ is formed over the substrate, covering the lower dielectric layer. The dielectric layer, for example, serves as a metal level of an ILD layer. In one embodiment, the dielectric layer serves as M1 level of the ILD layer. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed if desired to produce a planar surface.

Conductive lines $764_1$ are formed in the dielectric layer. The conductive lines may be formed by damascene technique. For example, the upper dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. In one embodiment, SL-R is formed to commonly couple $S_{TR1}$ and $S_{TR2}$ while other interconnects are formed for commonly coupling $D_{TW}$ and $D_{TR2}$ and commonly coupling $S_{TW}$ and $D_{TR1}$.

Figure 7I:
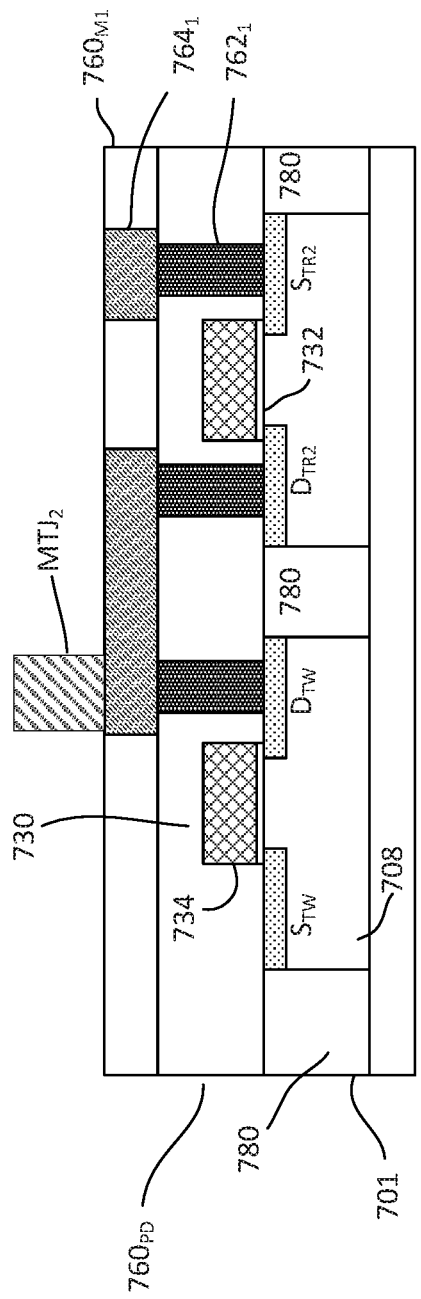

As shown in FIG. 7i, the process forms storage elements of the memory cell. In one embodiment, the process forms MTJ elements of the memory cells. For example, various layers of storage elements are formed on the dielectric layer and patterned to form $MTJ_1$ and $MTJ_2$ elements of the memory cell. Forming the storage elements may include forming the various layers of the storage elements on the dielectric layer $760_{M1}$. The layers may be formed by various deposition techniques. The deposition techniques may depend on the type of layer. The layers may be patterned to form the storage elements. Patterning the layers may be achieved using an anisotropic etch, such as RIE, with a patterned mask layer. Other techniques for forming the storage elements may also be useful.

Figure 7J:
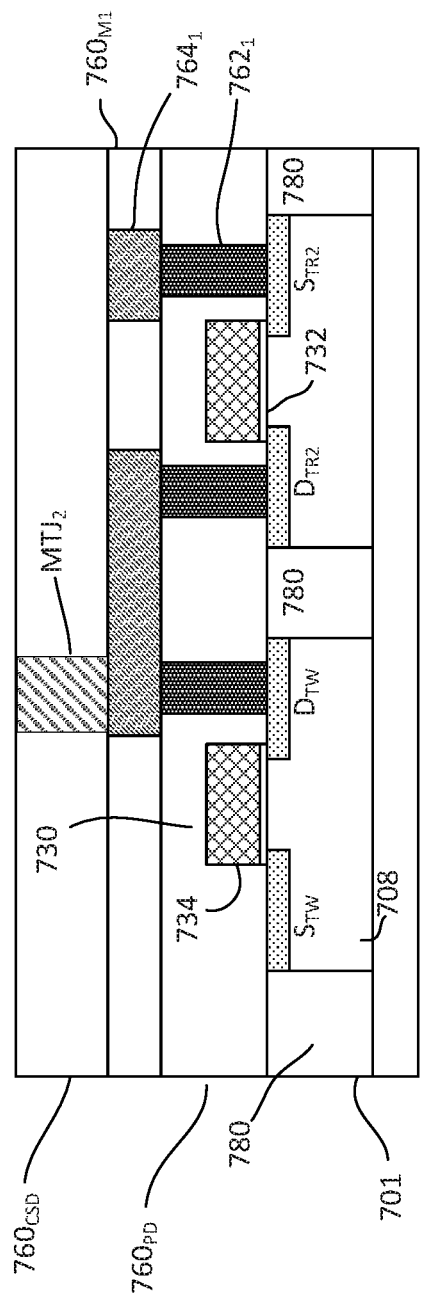

Referring to FIG. 7j, a storage dielectric layer $760_{CSD}$ is formed over the storage elements. The dielectric layer covers the storage elements. The storage dielectric layer, for example, is a silicon oxide layer. The storage dielectric layer may be formed by, for example, CVD. Other types of storage dielectric layers or forming techniques may also be useful. A planarization process is performed to remove excess dielectric material to form a planar surface. The planarization process, for example, is CMP. The planarization process exposes the top of the storage elements and provides a planar surface.

Figure 7K:
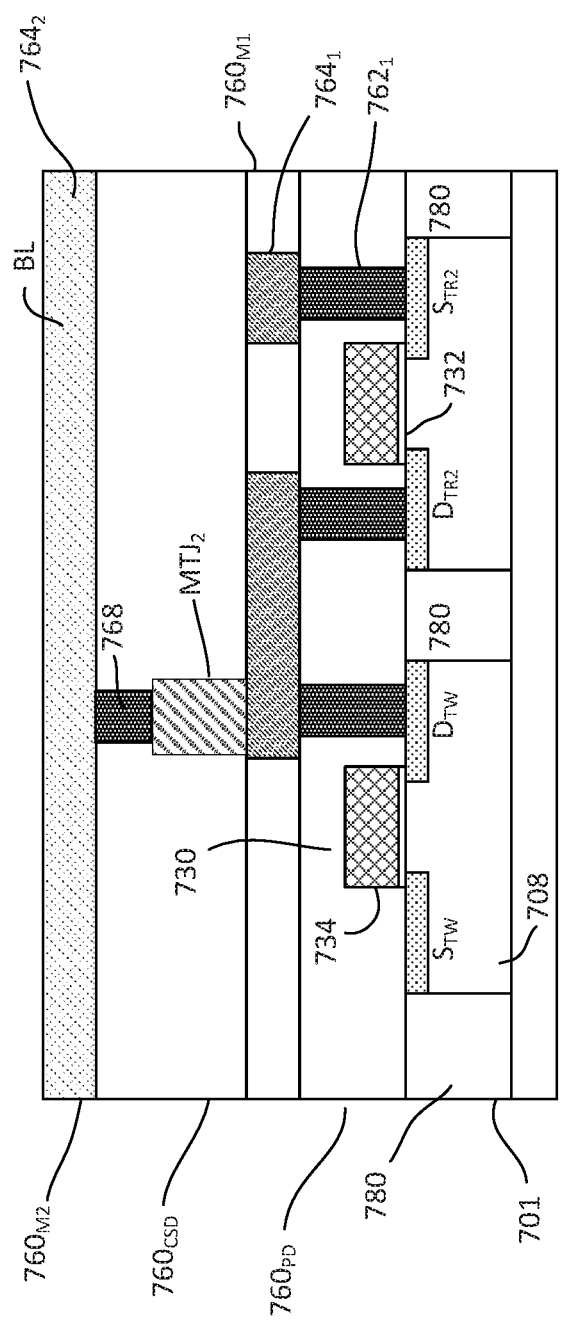

In FIG. 7k, a dielectric layer is formed over the substrate, covering the storage dielectric layer. The dielectric layer, for example, serves as a metal level of an ILD layer. In one embodiment, the dielectric layer serves as a metal level of the cell dielectric level. For example, the dielectric layer serves as M2 while the cell dielectric layer serves as V1. Other ILD levels may also be useful. The dielectric layer, for example, is a silicon oxide layer. Other types of dielectric layers may also be useful. The dielectric layer may be formed by CVD. Other techniques for forming the dielectric layer may also be useful. Since the underlying surface is already planar, a planarizing process may not be needed. However, it is understood that a planarization process, such as CMP, may be performed to produce a planar surface.

As shown in FIG. 7k, conductive lines 7642 and contact 768 are formed in the dielectric layer $760_{M2}$ and the storage dielectric layer $760_{CSD}$. The conductive lines and contacts may be formed using, for example, dual damascene techniques. For example, BL and SL-W may be formed in the dielectric layer $760_{M2}$. This provides a connection for the storage elements to BL and SL-W. For example, $MTJ_1$ is coupled to SL-W through a contact (not shown) and $MTJ_2$ is coupled to BL through a contact 768.

Additional processes may be performed to complete forming the device. For example, the processes may include forming additional ILD levels, pad level, passivation level, pad opening, dicing, assembly and testing. Other types of processes may also be performed.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory device with high sensing margin comprising:
    a memory cell having a storage unit coupled to a cell selector unit, wherein
        the storage unit comprises first and second storage elements, wherein each of the first and second storage elements comprises first and second terminals, wherein the second terminal of the first storage element is coupled to a write source line (SL-W) and the second terminal of the second storage element is coupled to a bit line (BL), and
        the cell selector unit comprises first and second selectors, wherein the first selector comprises a write select transistor ($T_W$) and the second selector comprises a first read transistor ($T_{R1}$) and a second read transistor ($T_{R2}$), wherein
        the dimensions of both $T_{R1}$ and $T_{R2}$ are smaller than the $T_W$,
        the first selector is coupled to a word line (WL) for selectively coupling a write path to the storage unit, and
        the second selector is coupled to a read line (RL) for selectively coupling a read path to the storage unit.

2. The memory device of claim 1 wherein the memory cell is a spin torque transfer-magnetic random access memory (STT-MRAM).

3. The memory device of claim 1 wherein the first storage element comprises a first magnetic tunnel junction ($MTJ_1$) element and the second storage element comprises a second magnetic tunnel junction ($MTJ_2$) element.

4. The memory device of claim 3 wherein:
    the $T_W$ comprises a gate terminal, a first source terminal ($S_{TW}$) and a second drain terminal ($D_{TW}$);
    the $T_{R1}$ comprises a gate terminal, a first source terminal ($S_{TR1}$) and a second drain terminal ($D_{TR1}$); and
    the $T_{R2}$ comprises a gate terminal, a first source terminal ($S_{TR2}$) and a second drain terminal ($D_{TR2}$).

5. The memory device of claim 4 wherein the $S_{TW}$ of $T_W$ is coupled to the first terminal of the $MTJ_1$ and the $D_{TW}$ of $T_W$ is coupled to the first terminal of the $MTJ_2$ and the gate terminal of $T_W$ is coupled to the WL.

6. The memory device of claim 5 wherein:
    the first source terminals $S_{TR1}$ and $S_{TR2}$ of $T_{R1}$ and $T_{R2}$ are coupled to a read source line (SL-R);
    the second drain terminal $D_{TR1}$ of $T_{R1}$ is commonly coupled to the first terminal of the $MTJ_1$ and $S_{TW}$ while the second drain terminal $D_{TR2}$ of $T_{R2}$ is commonly coupled to the first terminal of the $MTJ_2$ and the $D_{TW}$; and
    the gate terminals of $T_{R1}$ and $T_{R2}$ are coupled to the RL.

7. The memory device of claim 6 wherein the SL-W and the BL are coupled to a sense amplifier.

8. The memory device of claim 1 comprising a substrate prepared with a memory cell region having a write transistor active region and first and second read transistor active regions, wherein the $T_W$ is disposed in the write transistor active region, the $T_{R1}$ is disposed in the first read transistor active region and the $T_{R2}$ is disposed in the second read transistor active region.

9. The memory device of claim 8 wherein the $T_{R1}$ and $T_{R2}$ are aligned adjacent in a row direction and the $T_W$ is aligned adjacent to the $T_{R1}$ and $T_{R2}$ in a column direction within the memory cell region.

10. The memory device of claim 9 wherein:
    the $T_W$ comprises a gate, a first source region ($S_{TW}$) and a second drain region ($D_{TW}$), wherein the gate of $T_W$ serves as the WL and traverses the write transistor active region;
    the $T_{R1}$ comprises a gate, a first source region ($S_{TR1}$) and a second drain region ($D_{TR1}$); and
    the $T_{R2}$ comprises a gate, a first source region ($S_{TR2}$) and a second drain region ($D_{TR2}$), wherein the gate of $T_{R1}$ and the gate of $T_{R2}$ are a common gate which serves as the RL and traverses the first and second read transistor active regions.

11. The memory device of claim 10 comprising a dielectric layer having at least a first ILD level and a second ILD level disposed over the substrate, wherein the first ILD level comprises a pre-metal dielectric level and a first metal level (M1) while the second ILD level comprises a via level (V1) and a second metal level (M2).

12. The memory device of claim 11 wherein a read source line (SL-R) is disposed in M1 and the source regions $S_{TR1}$ and $S_{TR2}$ of the $T_{R1}$ and $T_{R2}$ are commonly coupled to the SL-R through contacts disposed in V1.

13. The memory device of claim 12 wherein the first and second storage elements are disposed in a storage dielectric layer over the M1, the first storage element is coupled to the first source region $S_{TW}$ of $T_W$ and second drain region $D_{TR1}$ of $T_{R1}$, while the second storage element is coupled to the second drain region $D_{TW}$ of $T_W$ and the second drain region $D_{TR2}$ of $T_{R2}$.

14. The memory device of claim 13 wherein the SL-W and BL are disposed in M2 and the SL-W is coupled to the first storage element while the BL is coupled to the second storage element.

15. A method of operating a memory device with high sensing margin comprising:
    providing a memory cell having a storage unit coupled to a cell selector unit, wherein
        the storage unit comprises first and second storage elements, wherein each of the first and second storage elements comprises first and second terminals, wherein the second terminal of the first storage element is coupled to a write source line (SL-W) and the second terminal of the second storage element is coupled to a bit line (BL), and
        the cell selector unit comprises first and second selectors, wherein the first selector comprises a write select transistor ($T_W$) and the second selector comprises a first read transistor ($T_{R1}$) and a second read transistor ($T_{R2}$), wherein
the dimensions of both $T_{R1}$ and $T_{R2}$ are smaller than the $T_W$,
the first selector is coupled to a word line (WL), and the second selector is coupled to a read line (RL); and
performing a read operation or write operation with the memory cell, wherein
when a write operation is performed, the $T_{R1}$ and $T_{R2}$ are switched off while the $T_W$ is switched on for selectively coupling a write path to the storage unit, and
when a read operation is performed, the $T_W$ is switched off while the $T_{R1}$ and $T_{R2}$ are switched on for selectively coupling a read path to the storage unit.

16. A method for forming a memory device with high sensing margin comprising:
forming a memory cell which comprises forming a storage unit and a cell selector unit, wherein the storage unit is coupled to the cell selector unit, and wherein
forming the storage unit comprises forming first and second storage elements, wherein each of the first and second storage elements comprises first and second terminals, coupling the second terminal of the first storage element to a write source line (SL-W) and coupling the second terminal of the second storage element to a bit line (BL), and
forming the cell selector unit comprises forming first and second selectors, wherein the first selector comprises a write select transistor ($T_W$) and the second selector comprises a first read transistor ($T_{R1}$) and a second read transistor ($T_{R2}$), wherein the dimensions of both $T_{R1}$ and $T_{R2}$ are smaller than the $T_W$, and coupling the first selector to a word line (WL) for selectively coupling a write path to the storage unit and coupling the second selector to a read line (RL) for selectively coupling a read path to the storage unit.

17. The method of claim 16 comprising providing a substrate prepared with a memory cell region having a write transistor active region and first and second read transistor active regions, wherein the $T_W$ is formed in the write transistor active region, the $T_{R1}$ is formed in the first read transistor active region and the $T_{R2}$ is formed in the second read transistor active region.

18. The method of claim 17 wherein the $T_{R1}$ and $T_{R2}$ are aligned adjacent in a row direction and the $T_W$ is aligned adjacent to the $T_{R1}$ and $T_{R2}$ in a column direction within the memory cell region.

19. The method of 18 wherein forming the $T_W$ and the $T_{R1}$ and $T_{R2}$ comprises:
forming a gate dielectric layer and a gate electrode layer over the substrate;
patterning the gate dielectric and gate electrode layers to define gates of the $T_W$, $T_{R1}$ and $T_{R2}$;
performing an implant to form a first source region ($S_{TW}$) and a second drain region ($D_{TW}$) adjacent to first and second sides of the gate of $T_W$, a first source region ($S_{TR1}$) and a second drain region ($D_{TR1}$) adjacent to first and second sides of the gate of $T_{R1}$, and a first source region ($S_{TR2}$) and a second drain region ($D_{TR2}$) adjacent to first and second sides of the gate of $T_{R2}$.

20. The method of claim 19 wherein the gate of the $T_W$ serves as the WL and the gate of $T_{R1}$ and the gate of $T_{R2}$ are a common gate which serves as the RL and traverses the first and second read transistor active regions.

* * * * *